(12) United States Patent
Coimbra et al.

(10) Patent No.: US 11,374,559 B2
(45) Date of Patent: Jun. 28, 2022

(54) LOW POWER COMPARATOR

(71) Applicant: NXP USA, INC., Austin, TX (US)

(72) Inventors: Ricardo Pureza Coimbra, Campinas (BR); Marcos Mauricio Pelicia, Campinas (BR); Eduardo Ribeiro da Silva, Campinas (BR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/876,619

(22) Filed: May 18, 2020

(65) Prior Publication Data

US 2021/0359673 A1    Nov. 18, 2021

(51) Int. Cl.
 *H03K 5/24* (2006.01)
(52) U.S. Cl.
 CPC .................... *H03K 5/2472* (2013.01)
(58) Field of Classification Search
 CPC ........ H03K 5/249; H03K 5/24; H03K 5/2472; H03M 1/466; H03M 1/468; H03M 1/067
 See application file for complete search history.

(56) References Cited

U.S. PATENT DOCUMENTS

| | | | | |
|---|---|---|---|---|
| 4,128,816 A * | 12/1978 | Shimotsuma | ......... | G04G 19/06 323/313 |
| 4,217,540 A * | 8/1980 | Shimotsuma | ......... | G04G 19/06 323/316 |
| 4,300,061 A * | 11/1981 | Mihalich | ................. | G05F 3/205 257/369 |
| 4,430,582 A * | 2/1984 | Bose | ................ | H03K 19/00384 326/32 |
| 4,477,737 A * | 10/1984 | Ulmer | ..................... | G05F 3/245 323/316 |
| 4,594,560 A * | 6/1986 | Dingwall | ................ | H03F 1/303 330/264 |
| 5,010,338 A * | 4/1991 | Miki | ...................... | H03K 5/249 327/63 |
| 5,262,685 A | 11/1993 | Demler et al. | | |
| 5,546,028 A * | 8/1996 | Yamaguchi | .......... | H03K 5/2481 327/64 |

(Continued)

FOREIGN PATENT DOCUMENTS

CN    103546127 A    1/2014

OTHER PUBLICATIONS

Chen, M., "A low-power auto-zeroed comparator for column-paralleled 14b SAR ADCs of 384×288 IRFPA ROIC", IEEE International Conference of Electron Devices and Solid-state Circuits, Jun. 3-5, 2013.

(Continued)

*Primary Examiner* — Thomas J. Hiltunen

(57) ABSTRACT

A low power comparator circuit is provided. The circuit includes a comparator core including a first stage. The first stage has an output configured to provide a digital value. A capacitor includes a first terminal coupled at an input of the first stage and a second terminal selectively coupled to a first input and a second input of the comparator core. A voltage generator is coupled to the first stage. The voltage generator is configured and arranged to generate a first voltage based on a predetermined input current and to limit a maximum current of the first stage based on the predetermined input current.

17 Claims, 5 Drawing Sheets

(56) References Cited

U.S. PATENT DOCUMENTS

| | | | | |
|---|---|---|---|---|
| 5,757,302 | A * | 5/1998 | Hino | H03M 1/002 341/155 |
| 5,880,623 | A * | 3/1999 | Levinson | G05F 3/247 326/33 |
| 5,936,433 | A * | 8/1999 | Holloway | H03K 5/249 327/74 |
| 5,952,951 | A * | 9/1999 | Fujino | H03K 5/249 326/84 |
| 5,973,517 | A * | 10/1999 | Kao | H03K 5/24 327/337 |
| 6,288,668 | B1 * | 9/2001 | Tsukamoto | H03M 7/165 341/172 |
| 6,788,239 | B2 * | 9/2004 | Suzuki | H03M 1/0604 341/159 |
| 6,861,878 | B2 * | 3/2005 | Haruhana | H03K 5/249 327/77 |
| 6,867,723 | B1 * | 3/2005 | Tachibana | H03M 1/002 341/155 |
| 7,586,432 | B2 * | 9/2009 | Maruyama | H03M 1/0845 341/155 |
| 8,593,319 | B2 * | 11/2013 | Kwon | H03M 3/324 341/143 |
| 8,680,925 | B2 * | 3/2014 | Christen | H03F 3/005 330/297 |
| 8,729,874 | B2 * | 5/2014 | Ochoa | G06K 19/0709 323/271 |
| 9,557,354 | B2 * | 1/2017 | Chen | G01R 19/16552 |
| 2002/0041249 | A1 * | 4/2002 | Ueno | H03K 5/2472 341/159 |
| 2011/0204926 | A1 * | 8/2011 | Inoue | H03K 5/24 327/89 |
| 2017/0346472 | A1 * | 11/2017 | Jain | H03K 5/08 |

OTHER PUBLICATIONS

Malathi, D., "A 4 bit medium speed flash ADC using inverter based comparator in 0.18μm CMOS", 19th international Symposium on VLSI Design and Test, Jun. 2015.

* cited by examiner

LOW POWER COMPARATOR

BACKGROUND

Field

This disclosure relates generally to electronic circuits, and more specifically, to a low power comparator circuit and method therefor.

Related Art

Today, many modern electronic devices incorporate circuitry for receiving analog signals and comparing those signals with reference voltages. Such circuits are often required to receive low voltage analog signals and determine differences at a high rate of speed. However, these circuits may suffer from high current drain and accuracy issues. It is thus desirable to provide circuitry that provides a low power, high speed, and high accuracy solution.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a low power, high speed comparator circuit. The comparator circuit includes a chain of current-limited stages. A voltage generation circuit is configured to provide predetermined operating voltages for the stages of the comparator circuit such that a maximum cross-conduction current of each stage is limited to a predetermined current value. The comparator circuit further includes a switch configuration to selectively couple input voltages at inputs of the comparator, and in turn, generate a digital output value based on a difference between the input voltages. The switch configuration operates in a calibration state serving to auto-zero circuitry of the comparator circuit when one of the input voltages is sampled.

Figure 1:
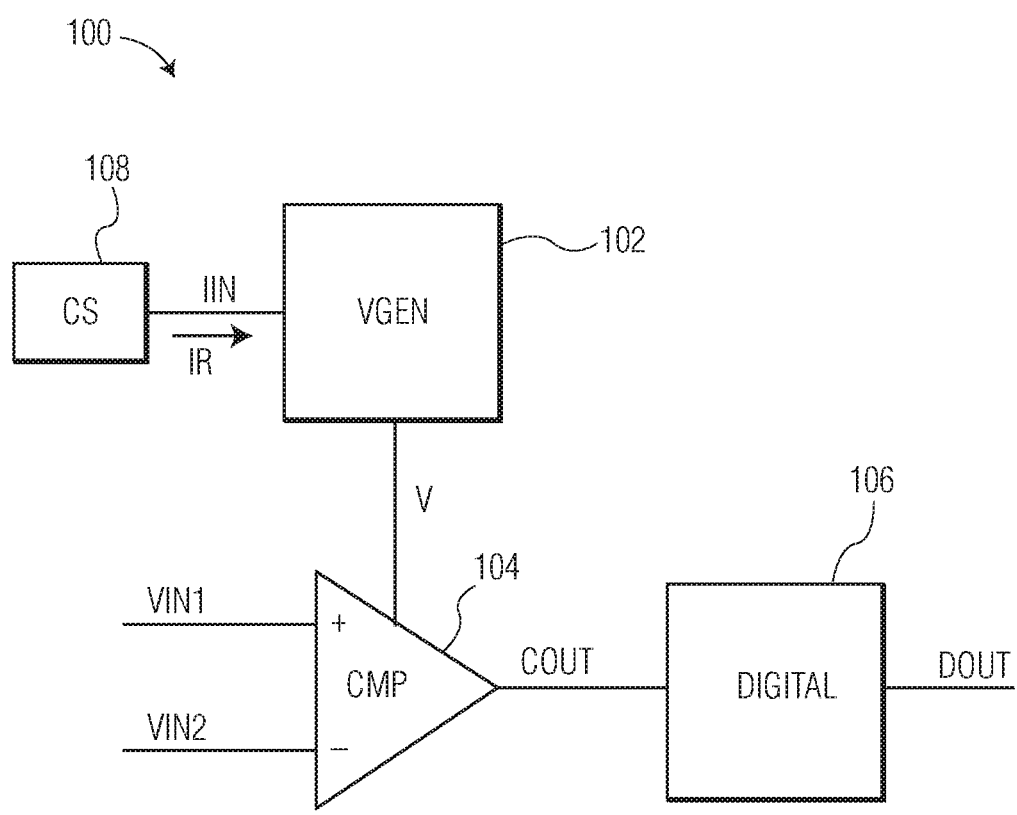
FIG. 1 illustrates, in simplified block diagram form, an example low power comparator in accordance with an embodiment.

FIG. 1 illustrates, in simplified block diagram form, an example low power comparator 100 in accordance with an embodiment. Comparator 100 is implemented as an integrated circuit and has a first input terminal labeled VIN1 for receiving a first input voltage signal VIN1, a second input terminal labeled VIN2 for receiving a second input voltage signal VIN2, an output terminal labeled DOUT for providing a digital output signal DOUT. In this embodiment, comparator 100 includes a voltage generator circuit 102 labeled VGEN, a comparator core circuit 104 labeled CMP, a digital circuit 106 labeled DIGITAL, and a current source circuit 108 labeled CS.

The voltage generator 102 is coupled to the current source 108 by way of an input current interconnect labeled IIN and coupled to the comparator core 104 by way of output voltage terminal labeled V. The voltage generator 102 is configured to generate voltage V based on a predetermined input current IR received from the current source 108. The generated voltage V is provided to the comparator core 104 and may serve as an operating voltage for circuitry within the comparator core 104. In some embodiments, the voltage generator 102 may be configured to generate a plurality of voltages (e.g., V1 and V2 shown in FIG. 2) based on the predetermined input current IR and provide the generated plurality of voltages to the comparator core 104.

The comparator core 104 is configured to compare the first input voltage VIN1 at the first input VIN1 with the second input voltage VIN2 at the second input VIN2 and in turn, generate a digital value COUT based on a difference between the first input voltage and the second input voltage. The digital circuit 106 is coupled to an output of the comparator core 104 by way of an interconnect labeled COUT. The digital value generated at the output of the comparator core 104 is provided to an input of the digital circuit 106. The digital circuit 106 may include any suitable circuitry to receive the COUT value and in turn, provide a digital output signal DOUT at an output labeled DOUT.

Figure 2:
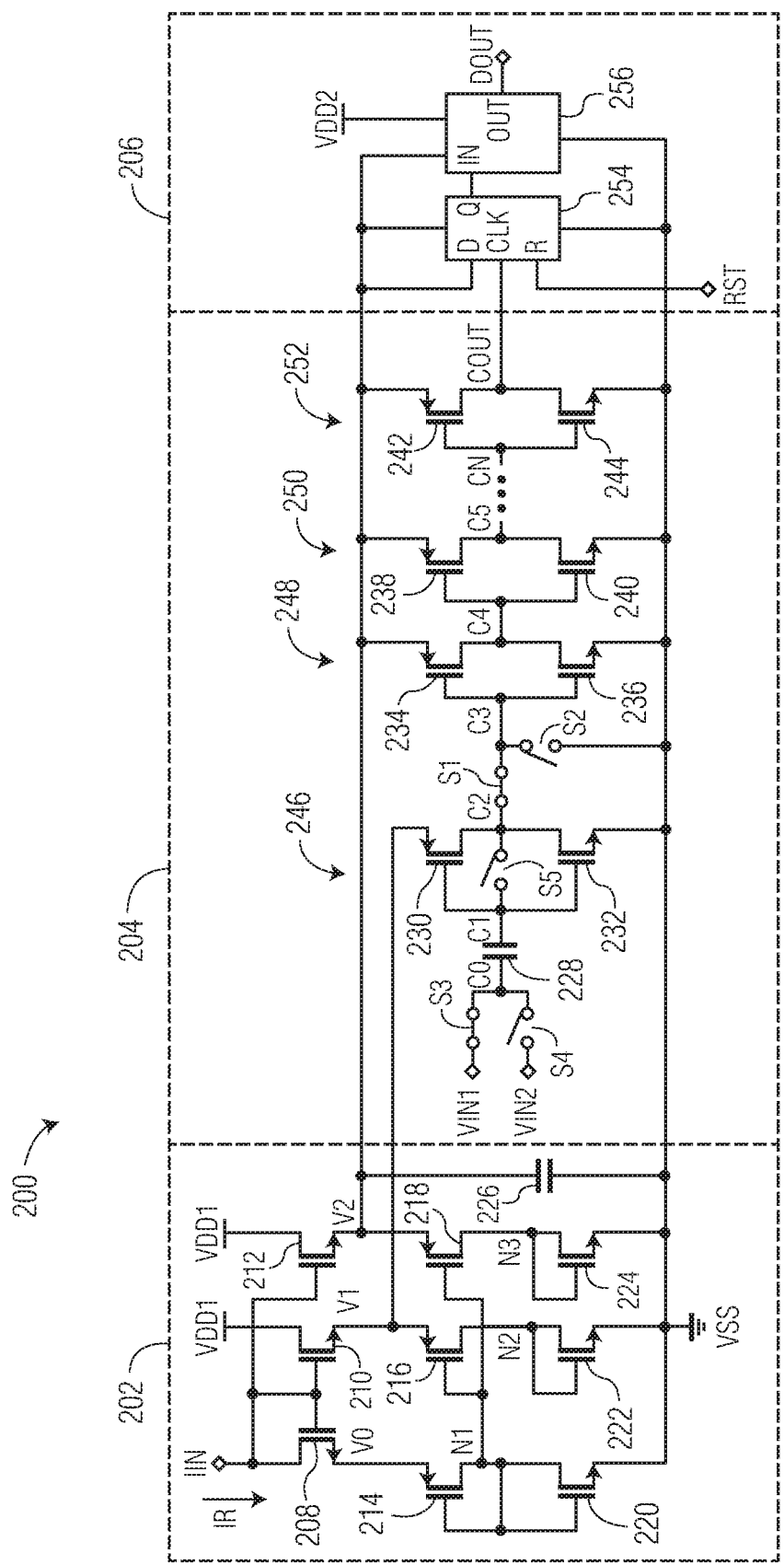
FIG. 2 illustrates, in simplified schematic diagram form, an example comparator implementation in accordance with an embodiment.

FIG. 2 illustrates, in simplified schematic diagram form, an example comparator implementation 200 in accordance with an embodiment. In this embodiment, the comparator implementation 200 includes an example voltage generator circuit 202, an example comparator core circuit 204, and an example digital circuit 206 corresponding to the voltage generator 102, comparator core 104, and digital circuit 106 of FIG. 1.

The voltage generator circuit 202 has an input current terminal labeled IIN configured for receiving a predetermined current IR and output terminals labeled V1 and V2 configured for providing desired generated voltages V1 and V2. A current source as shown in FIG. 1 may be coupled to the IIN terminal to provide the IR current. In this embodiment, the voltage generator circuit 202 includes N-channel transistors 208-212 and 220-224, P-channel transistors 214-218, and capacitor 226.

A first current electrode of transistor 208 and control electrodes of transistors 208-212 are coupled at the IIN terminal. A second current electrode of transistor 208 is coupled to a first current electrode of transistor 214 at node V0. A second current electrode of transistor 214 is coupled to a first current electrode of transistor 220 and control electrodes of transistors 214-220 at node N1. A second current electrode of transistor 220 is coupled to a first voltage supply terminal labeled VSS. In this embodiment, a ground voltage is supplied at the VSS supply terminal. In this embodiment, transistors 214 and 220 are configured as diodes connected in series and biased with the IR current to establish a desired voltage V0 at node V0 (e.g., |VGS| of transistor 214+VGS of transistor 220). In this embodiment, transistors 214 and 220 are configured to set a predetermined maximum short circuit limit proportional to the IR current and based on a maximum current through the series connected transistors 214 and 220.

A first current electrode of transistor 210 is coupled to a second voltage supply terminal labeled VDD1. In this embodiment, an analog operating voltage (e.g., operating voltage for analog circuitry) is supplied at the VDD1 supply terminal. A second current electrode of transistor 210 is coupled to a first current electrode of transistor 216 at the output terminal V1. A second current electrode of transistor 216 is coupled to a first current electrode and control electrode of transistor 222 at node N2. A second current electrode of transistor 222 is coupled to the VSS supply terminal.

In this embodiment, transistors 208, 210, 214, and 216 are configured to form a first class-AB buffer stage. In this embodiment, transistors 210, 216, and 222 are formed to have sizes (e.g., width, length) substantially matching transistors 208, 214, and 220 sizes, respectively, allowing the voltage V0 generated in a first branch of the first buffer to be mirrored into a low-impedance (e.g., regulated) V1 voltage in a second branch of the first buffer supplied at the V1 terminal. In other embodiments, the transistors 210, 216, and 222 may have sizes different from the transistors 208, 214, and 220 sizes for generating other voltages at the V1 terminal.

A first current electrode of transistor 212 is coupled to the VDD1 supply terminal. A second current electrode of transistor 212 is coupled to a first current electrode of transistor 218 at the output terminal V2. A second current electrode of transistor 218 is coupled to a first current electrode and control electrode of transistor 224 at node N3. A second current electrode of transistor 224 is coupled to the VSS supply terminal. A first terminal of the capacitor 226 is coupled at the V2 terminal and a second terminal of the capacitor 226 is coupled at the VSS supply terminal.

In this embodiment, transistors 208, 212, 214, and 218 are configured to form a second class-AB buffer stage. In this embodiment, transistors 212, 218, and 224 are formed to have sizes (e.g., width, length) substantially matching transistors 208, 214, and 220 sizes, respectively, allowing the voltage V0 generated in a first branch of the second buffer to be mirrored into a low-impedance (e.g., regulated) V2 voltage in a second branch of the second buffer supplied at the V2 terminal. In other embodiments, the transistors 212, 218, and 224 may have sizes different from the transistors 208, 214, and 220 sizes for generating other voltages at the V2 terminal.

The comparator core circuit 204 has a first input terminal labeled VIN1 for receiving a first input voltage signal VIN1, a second input terminal labeled VIN2 for receiving a second input voltage signal VIN2, an output terminal labeled COUT. In this embodiment, the comparator core circuit 204 includes a first stage 246, a second stage 248, a third stage 250, a fourth stage 252, a switch configuration including switches S1-S5, and an input capacitor 228.

The input terminals VIN1 and VIN2 are selectively coupled to an input of the first stage by way of capacitor 228 and switches S3 and S4. In this embodiment, the first stage includes P-channel transistor 230 coupled in series with N-channel transistor 232. A first current electrode of transistor 230 is coupled to the V1 terminal to receive the generated voltage V1. In this embodiment, the V1 voltage serves as an operating voltage for the first stage. A second current electrode of transistor 230 is coupled to a first current electrode of transistor 232 at output node C2 and a second current electrode of transistor 232 is coupled at the VSS supply terminal. A control electrode of transistor 230 is coupled to a control electrode of transistor 232 and a first terminal of capacitor 228 at input node C1. A second terminal of capacitor 228 is coupled to a first terminal of switch S3 and a first terminal of switch S4 at node C0. A second terminal of switch S3 is coupled at the VIN1 terminal and a second terminal of switch S4 is coupled at the VIN2 terminal. A first terminal of switch S5 is coupled at the node C1 and a second terminal of switch S5 is coupled at the node C2.

In this embodiment, the first stage 246 is coupled to the second stage 248 by way of switch S1. A first terminal of switch S1 is coupled at the node C2 and a second terminal of switch S1 is coupled at the input node C3. In other embodiments, the first stage 246 may be coupled to the second stage 248 by way of a logic gate, other circuit elements, and the like for example. A first terminal of switch S2 is coupled at node C3 and a second terminal of switch S2 is coupled at the VSS supply terminal. In this embodiment, the second stage 248, the third stage 250, and the fourth stage 252 may be characterized as a series of gain stages configured to condition (e.g., sharpen) the output signal generated at the output of the first stage 246. Three gain stages 248-252 are depicted in the comparator core circuit 204 of FIG. 2. In other embodiments, other suitable numbers of gain stages may be utilized. The second stage 248, third stage 250, and fourth stage 252 are coupled between the V2 terminal and VSS supply terminal and include P-channel transistors 234, 238, 242 and N-channel transistors 236, 240, 244 respectively. In this embodiment, the V2 voltage serves as an operating voltage for the second, third, and fourth stages.

The second stage 248 includes an input coupled at node C3 and an output coupled at node C4. A first current electrode of transistor 234 is coupled to the V2 terminal to receive the generated voltage V2. A second current electrode of transistor 234 is coupled to a first current electrode of transistor 236 at node C4 and a second current electrode of transistor 236 is coupled at the VSS supply terminal. Control electrodes of transistors 234 and 236 are coupled together at node C3.

The third stage 250 includes an input coupled at node C4 and an output coupled at node C5. A first current electrode of transistor 238 is coupled to the V2 terminal to receive the generated voltage V2. A second current electrode of transistor 238 is coupled to a first current electrode of transistor 240 at node C5 and a second current electrode of transistor 240 is coupled at the VSS supply terminal. Control electrodes of transistors 238 and 240 are coupled together at node C4.

The fourth stage 252 includes an input coupled at node CN and an output coupled at node COUT. A first current electrode of transistor 242 is coupled to the V2 terminal to receive the generated voltage V2. A second current electrode of transistor 242 is coupled to a first current electrode of transistor 244 at node COUT and a second current electrode of transistor 244 is coupled at the VSS supply terminal. Control electrodes of transistors 242 and 244 are coupled together at node CN. In this embodiment, node CN is coupled to node C5. A set of three dots ( . . . ) shown between node C5 and node CN illustrates that in some embodiments, other stages may be coupled in place of the set of three dots.

In operation, the first stage 246 along with the switches S1-S5 are configured to compare the first input voltage VIN1 with the second input voltage VIN2 and in turn, generate a digital value at the output node C2 based on the difference between the first input voltage VIN1 and the second input voltage VIN2. The digital value is propagated with fast transition times and minimal power by way of the series of gain stages including the second stage 248, the third stage 250, and the fourth stage 252, for example, and provided at the COUT output. The V1 voltage and the V2 voltage are generated in separate circuit legs of the voltage generator circuit 202 allowing for any switching noise at the V2 terminal to be isolated from the V1 terminal, and thus providing for more accurate comparator operation. Because the V1 and V2 voltage generation is based on the IR current, the maximum short circuit current of all of the stages (e.g., stages 246-252) is limited to a ratio of the IR current value.

The digital circuit 206 has an input coupled for receiving the COUT signal and an output terminal labeled DOUT for providing the DOUT signal. In this embodiment, the digital circuit 206 includes an example latch circuit 254 and an example level shifter circuit 256. In other embodiments, the digital circuit 206 may include any suitable digital circuitry.

The latch circuit 254 is coupled to receive the COUT signal and in turn, generate a latched signal at the Q output. A reset terminal labeled RST may receive a reset signal for resetting the state of the latch circuit 254. In this embodiment, the latch circuit 254 is coupled between the V2 terminal and the VSS supply terminal. The level shifter circuit 256 is coupled to receive the latched output signal from the latch circuit 254 and in turn, generate a level-shifted version of the latched signal, for example. In this embodiment, the level shifter circuit 256 is coupled between the V2 terminal and the VSS supply terminal. The level shifter circuit 256 is coupled to a third voltage supply terminal labeled VDD2. In this embodiment, a digital operating voltage (e.g., operating voltage for digital circuitry) is supplied at the VDD2 supply terminal. In this embodiment, the COUT signal includes logic states based on supply voltages V2 and VSS, and the DOUT signal includes logic states based on the supply voltages VDD2 and VSS.

Figure 3A:
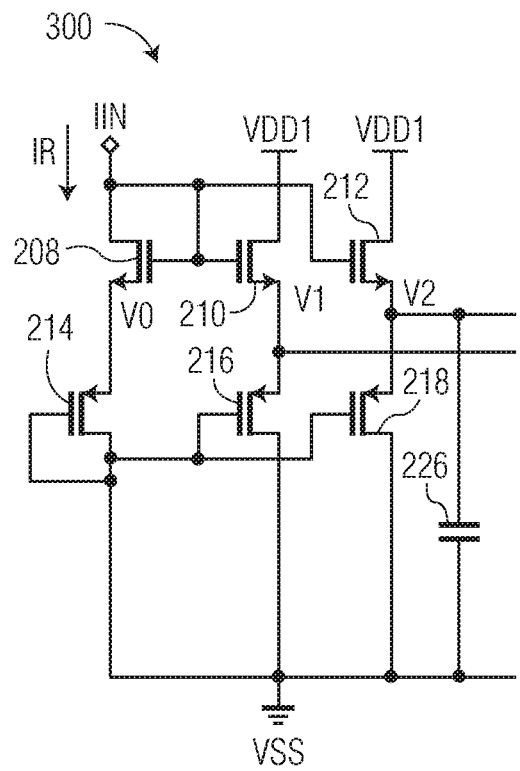
FIG. 3A and FIG. 3B illustrate, in simplified schematic diagram form, example alternative configurations of a voltage generator circuit implementation in accordance with an embodiment.
Figure 3B:
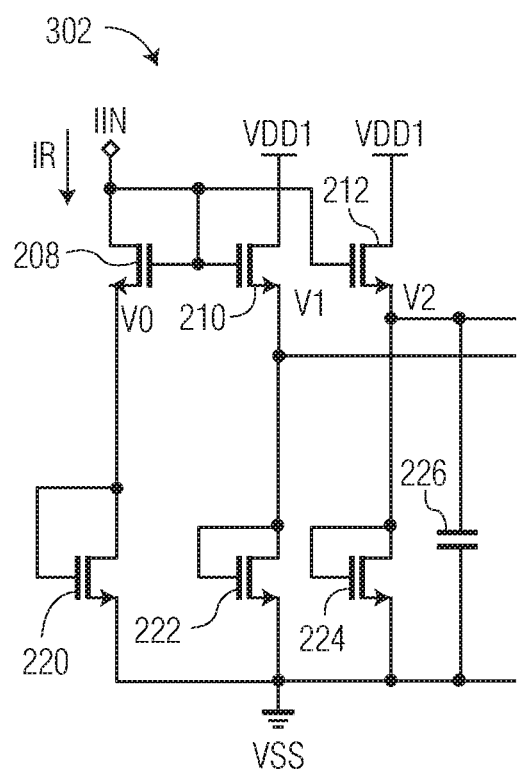

FIG. 3A and FIG. 3B illustrate, in simplified schematic diagram form, example alternative configurations 300 and 302 of the voltage generator circuit 202 depicted in FIG. 2 in accordance with an embodiment. In FIG. 3A, a first alternative voltage generator circuit 300 corresponds to the voltage generator circuit 202 without implementing the N-channel transistors 220-224, and in FIG. 3B, a second alternative voltage generator circuit 302 corresponds to the voltage generator circuit 202 without implementing the P-channel transistors 214-218.

The voltage generator circuit 300 includes input current terminal IIN configured for receiving the predetermined current IR and output terminals V1 and V2 configured for providing desired generated voltages V1 and V2. In this embodiment, the voltage generator circuit 300 includes N-channel transistors 208-212, P-channel transistors 214-218, and capacitor 226. The transistors 220-224 (depicted in FIG. 2) are bypassed or not implemented in the voltage generator circuit 300 configuration.

The first current electrode of transistor 208 and control electrodes of transistors 208-212 are coupled at the IIN terminal. The second current electrode of transistor 208 is coupled to the first current electrode of transistor 214 at node V0. The second current electrode of transistor 214 is coupled to control electrodes of transistors 214-218 at the VSS supply terminal. The first current electrode of transistor 210 is coupled to the VDD1 supply terminal and the second current electrode of transistor 210 is coupled to the first current electrode of transistor 216 at the output terminal V1. The first current electrode of transistor 212 is coupled to the VDD1 supply terminal and the second current electrode of transistor 212 is coupled to the first current electrode of transistor 218 at the output terminal V2. Second current electrode of transistors 216 and 218 are coupled to the VSS supply terminal. The first terminal of the capacitor 226 is coupled at the V2 terminal and the second terminal of the capacitor 226 is coupled at the VSS supply terminal. In this embodiment, transistor 214 is configured to set a predetermined maximum P-channel peak current limit proportional to the IR current and based on a maximum current through the transistor 214. For example, the voltage generator circuit 300 may be coupled to provide the V1 voltage to the first stage 246 of FIG. 2 such that the peak current of P-channel transistor 230 is limited to the predetermined maximum P-channel peak current limit.

The voltage generator circuit 302 includes input current terminal IIN configured for receiving the predetermined current IR and output terminals V1 and V2 configured for providing desired generated voltages V1 and V2. In this embodiment, the voltage generator circuit 300 includes N-channel transistors 208-212 and 220-224, and capacitor 226. The transistors 214-218 (depicted in FIG. 2) are bypassed or not implemented in the voltage generator circuit 302 configuration.

The first current electrode of transistor 208 and control electrodes of transistors 208-212 are coupled at the IIN terminal. The second current electrode of transistor 208 is coupled to the first current electrode and control electrode of transistor 220 at node V0. The first current electrode of transistor 210 is coupled to the VDD1 supply terminal and the second current electrode of transistor 210 is coupled to the first current electrode and control electrode of transistor 222 at the output terminal V1. The first current electrode of transistor 212 is coupled to the VDD1 supply terminal and the second current electrode of transistor 212 is coupled to the first current electrode and control electrode of transistor 224 at the output terminal V2. Second current electrode of transistors 220-224 are coupled to the VSS supply terminal. The first terminal of the capacitor 226 is coupled at the V2 terminal and the second terminal of the capacitor 226 is coupled at the VSS supply terminal. In this embodiment, transistor 220 is configured to set a predetermined maximum N-channel peak current limit proportional to the IR current and based on a maximum current through the transistor 220. For example, the voltage generator circuit 302 may be coupled to provide the V1 voltage to the first stage 246 of FIG. 2 such that the peak current of N-channel transistor 232 is limited to the predetermined maximum N-channel peak current limit.

Figure 4A:
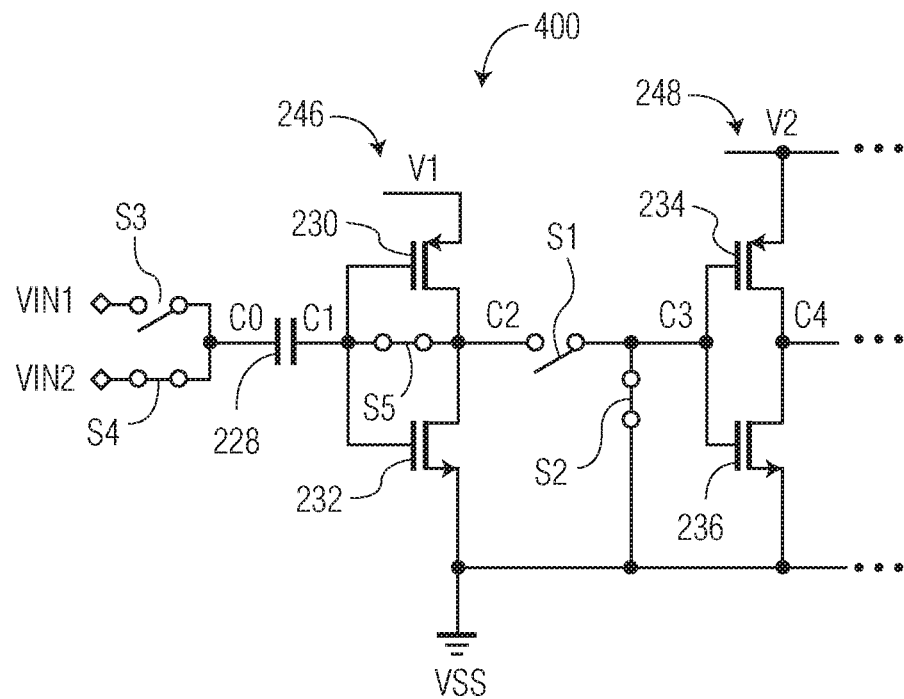
FIG. 4A and FIG. 4B illustrate, in simplified schematic diagram form, example switch configuration settings of the example comparator core implementation in accordance with an embodiment.
Figure 4B:
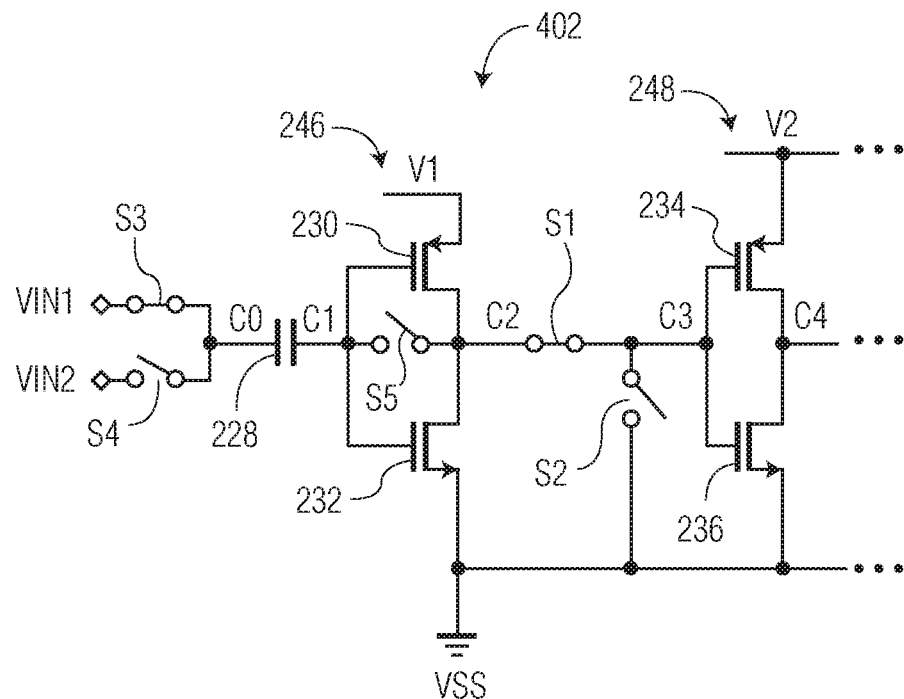

FIG. 4A and FIG. 4B illustrate, in simplified schematic diagram form, example switch configuration settings 400 and 402 of the example comparator core circuit 204 in accordance with an embodiment. In FIG. 4A and FIG. 4B, a portion of the comparator core circuit 204 is shown including the first stage 246, the second stage 248, and the switch configuration of switches S1-S5. A first set of switch settings 400 depicted in FIG. 4A corresponds to a first phase (PHASE1) of operation and a second set of switch settings 402 depicted in FIG. 4B corresponds to a second phase (PHASE2) of operation.

The PHASE1 switch settings 400 include switches S1 and S3 configured in an open state and switches S2, S4, and S5 configured in a closed state. The PHASE1 switch settings 400 allow for the VIN2 voltage at the VIN2 input to be sampled by way of switch S4 while the second stage 248 is isolated from the first stage 246 by way of switch S1. In this phase, the first stage 246 is configured in a calibration state initializing the charge stored on capacitor 228 with the input and output of the first stage 246 shorted together by way of switch S5. The amount of charge (Q) stored in capacitor 228 may be represented by the equation Q=C (VIN2−VX), where C is the capacitance value of capacitor 228, VIN2 is the voltage value sampled at the VIN2 input, and VX is the first stage crossing threshold voltage value. The input of the second stage 248 is coupled to the VSS supply terminal by way of switch S2 putting the second stage (and subsequent stages) into a safe state (e.g., non-floating state). In other embodiments, the second stage (and subsequent stages) may be into a safe state by way of a logic gate, other circuit elements, and the like, for example.

The PHASE2 switch settings 402 include switches S2, S4, and S5 configured in an open state and switches S1 and S3 configured in a closed state. The PHASE2 switch settings 402 allow for the VIN1 voltage at the VIN1 input to be sampled by way of switch S3 and compared with the voltage stored on the capacitor 228 during the calibration state. In this phase, the first stage 246 is configured in a monitoring state generating a digital value at the output node C2 based on a difference between the VIN1 voltage and the VIN2 voltage. For example, when the sampled VIN1 voltage is higher than the VIN2 sampled voltage, the output signal will transition to a logic low level, and when the sampled VIN1 voltage is lower than the VIN2 sampled voltage, the output signal will transition to a logic high level. The input of the second stage 248 is coupled to the output of the first stage 246 by way of switch S2 allowing the second stage (and subsequent stages) to amplify the generated digital value.

Figure 4C:
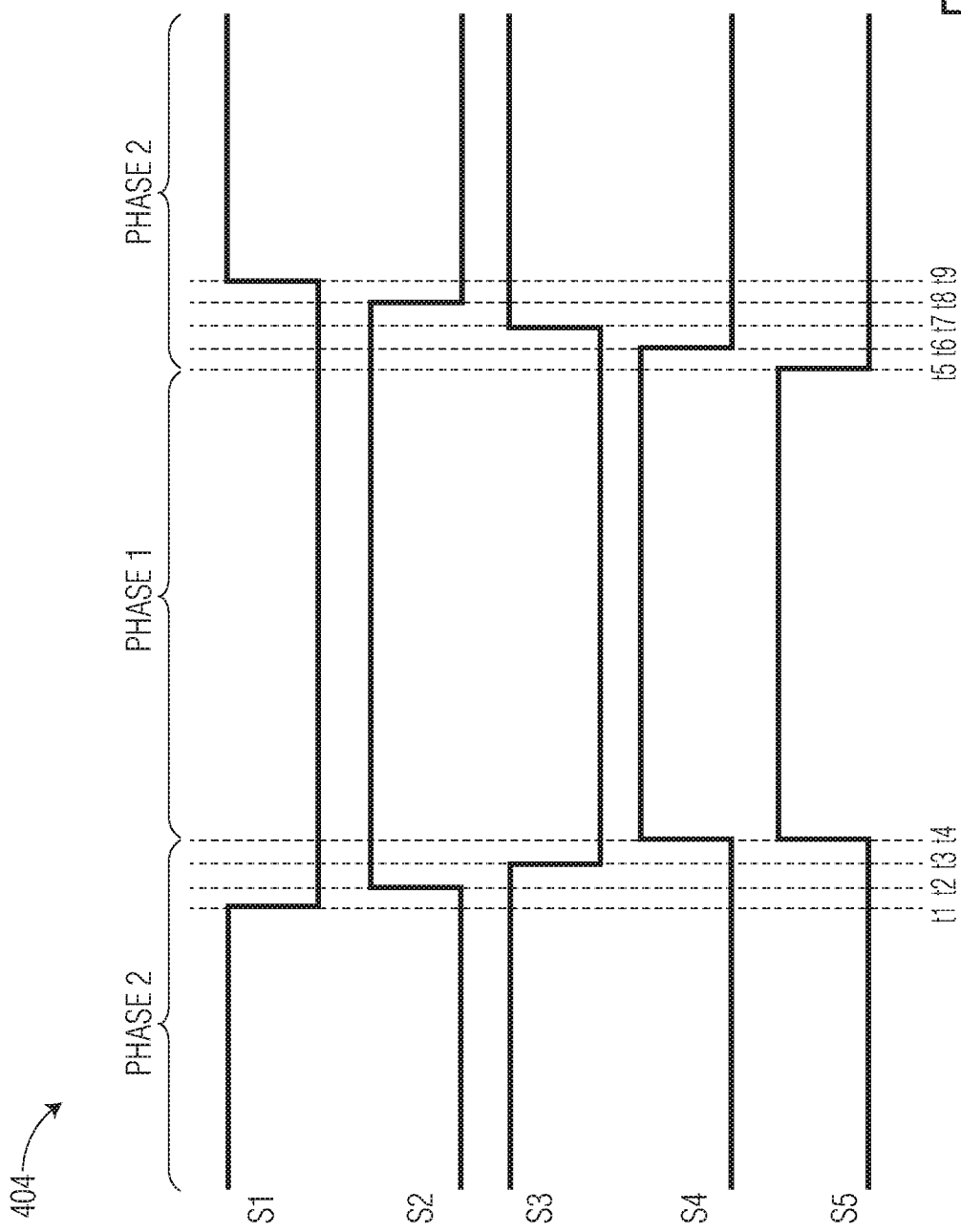
FIG. 4C illustrates, in plot diagram form, example switch timing of the example comparator core implementation in accordance with an embodiment.

FIG. 4C illustrates, in plot diagram form, example switch timing 404 of the example comparator core circuit 204 in accordance with an embodiment. The switch timing 404 includes control signal timing waveforms S1-S5 corresponding to switches S1-S5 as depicted in FIG. 4A and FIG. 4B. The waveforms S1-S5 illustrated in FIG. 4C are shown with logic high and logic low values versus time. For example, the waveform logic high time corresponds to a closed switch state period and the waveform logic low time corresponds to an open switch state period of switches S1-S5.

In this embodiment, control signals S1-S5 may be formed as non-overlapping signals to facilitate sequencing of switches S1-S5 (e.g., opening and closing transitions) in a manner sufficient to minimize charge injection, redistribution, and/or cross-conduction. For example, a first sequencing of control signals S1-S5 is depicted during a transition from PHASE2 (e.g., monitoring state) to PHASE1 (e.g., calibration state) and a second sequencing of control signals S1-S5 is depicted during a transition from PHASE1 to PHASE2. In the PHASE2 to PHASE1 control signal sequence of the comparator core circuit 204, the S1 switch is opened at time t1. At time t2, the S2 switch is closed and at time t3, the S3 switch is opened. At time t4, the S4 and S5 switches are closed. In the PHASE1 to PHASE2 control signal sequence of the comparator core circuit 204, the S5 switch is opened at time t5. At time t6, the S4 switch is opened and at time t7, the S3 switch is closed. At time t8, the S2 switch is opened and at time t9, the S5 switch is closed.

Generally, there is provided, a circuit including a comparator core including a first stage, the first stage having an output configured to provide a digital value; a capacitor having a first terminal coupled at an input of the first stage and a second terminal selectively coupled to a first input and a second input of the comparator core; and a voltage generator coupled to the first stage, the voltage generator configured and arranged to generate a first voltage based on a predetermined input current and to limit a maximum current of the first stage based on the predetermined input current. The comparator core may further include a second stage selectively coupled in series with the first stage. The second stage of the comparator core may be configured to be in a safe state when isolated from the first stage. The voltage generator may be coupled to the second stage and the voltage generator may be configured and arranged to generate the first voltage as an operating voltage for the first stage and the second stage. The voltage generator may be configured and arranged to generate the first voltage as an operating voltage for the first stage, and wherein the voltage generator may be further configured and arranged to generate a second voltage as an operating voltage for the second stage, the second voltage based on the predetermined input current. The second terminal of the capacitor may be selectively coupled to the first input of the comparator core by way of a first switch and selectively coupled to the second input of the comparator core by way of a second switch. The first stage may further include a third switch coupled between the input and the output of the first stage, the second switch and the third switch configured to be closed when a voltage is sampled at the second input of the comparator core. The voltage generator may include a buffer, a first branch of the buffer configured to receive the predetermined input current and a second branch of the buffer configured to generate the first voltage. The voltage generator may further include a first transistor and a second transistor coupled in series in the first branch of the buffer, the first and second transistors configured to limit the maximum current of the first stage, the maximum current characterized as a maximum short circuit current of the first stage.

In another embodiment, there is provided, a circuit including a comparator core configured to compare a first input voltage at a first input with a second input voltage at a second input and generate a digital value at an output based on a difference between the first input voltage and the second input voltage, the comparator core including a first stage having an input selectively coupled to the first input and the second input; and a voltage generator coupled to provide a first operating voltage to the first stage, the voltage generator configured and arranged to generate the first operating voltage based on a predetermined input current and to limit a maximum current of the first stage based on the predetermined input current. The input of the first stage may be selectively coupled to the first input and the second input by way of a capacitor, a first switch and a second switch, a first terminal of the capacitor coupled to the input of the first stage and a second terminal of the capacitor coupled to the first input of the comparator core by way of the first switch and coupled to the second input of the comparator core by way of the second switch. The first stage may include a first transistor having a first current electrode coupled to the voltage generator to receive the first operating voltage; and a second transistor having a control electrode coupled to a control electrode of the first transistor to form the input of the first stage, a first current electrode coupled to a second current electrode of the first transistor to form an output of the first stage, and a second current electrode coupled to supply terminal. The comparator core may further include a second stage selectively coupled in series with the first stage, the second stage configured to be in a safe state when isolated from the first stage. The voltage generator may be further coupled to provide a second operating voltage to the second stage, the voltage generator configured and arranged to generate the second operating voltage based on the predetermined input current. The voltage generator may include a buffer, a first branch of the buffer configured to receive the predetermined input current and a second branch of the buffer configured to generate the first operating voltage. The voltage generator may further include a transistor pair coupled in series in the first branch of the buffer, the transistor pair configured to limit the maximum current of the first stage.

In yet another embodiment, there is provided, a circuit including a comparator core configured and arranged to compare a first input voltage at a first input with a second input voltage at a second input and generate a digital value based on a difference between the first input voltage and the second input voltage, the comparator core comprising: a first transistor having a first current electrode coupled to a first voltage supply terminal; a second transistor, the second transistor having a control electrode coupled to a control electrode of the first transistor to form a first stage input, a first current electrode coupled to a second current electrode of the first transistor to form a first stage output, and a second current electrode coupled to a second voltage supply terminal; a capacitor having a first terminal coupled at the first stage input and a second terminal coupled to the first input by way of a first switch and coupled to the second input by way of a second switch; and a voltage generator coupled to provide an operating voltage at the first voltage supply terminal, the voltage generator configured and arranged to limit a maximum current through the first transistor and second transistor based on a predetermined input current. The voltage generator may be further configured and arranged to generate the operating voltage based on the predetermined input current. The voltage generator may include a buffer, a first branch of the buffer configured to receive the predetermined input current and a second branch of the buffer configured to generate the operating voltage. The voltage generator may further include a transistor pair coupled in series in the first branch of the buffer, the transistor pair configured to limit the maximum current of the first stage.

By now it should be appreciated that there has been provided, a low power, high speed comparator circuit. The comparator circuit includes a chain of current-limited stages. A voltage generation circuit is configured to provide predetermined operating voltages for the stages of the comparator circuit such that a maximum cross-conduction current of each stage is limited to a predetermined current value. The comparator circuit further includes a switch configuration to selectively couple input voltages at inputs of the comparator, and in turn, generate a digital output value based on a difference between the input voltages. The switch configuration operates in a calibration state serving to auto-zero circuitry of the comparator circuit when one of the input voltages is sampled.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
   a comparator core including:
      a first stage, the first stage having an output configured to provide a digital value;
      a capacitor having a first terminal coupled at an input of the first stage and a second terminal selectively coupled to a first input and a second input of the comparator core;
      a second stage selectively coupled to the first stage via a first switch, the first switch coupled to the output of the first stage and an input to the second stage, a second switch coupled to the input to the second stage and a ground potential; and
   a voltage generator coupled to the first stage, the second stage, and a third stage, the voltage generator configured and arranged to generate and provide a first voltage to the first stage and a second, different voltage to the second stage and the third stage based on a predetermined input current, a maximum current of the first stage and the second stage being based on the predetermined input current.

2. The circuit of claim 1, wherein the second stage is selectively coupled in series with the first stage.

3. The circuit of claim 2, wherein the second stage of the comparator core is configured to be in a safe state when isolated from the first stage.

4. The circuit of claim 2, wherein the voltage generator is configured and arranged to generate the first voltage as an operating voltage for the first stage, and wherein the voltage generator is further configured and arranged to generate the second voltage as an operating voltage for the second stage.

5. The circuit of claim 1, wherein the second terminal of the capacitor is selectively coupled to the first input of the comparator core by way of a third switch and selectively coupled to the second input of the comparator core by way of a fourth switch.

6. The circuit of claim 5, wherein the first stage further comprises a fifth switch coupled between the input and the output of the first stage, the fourth switch and the fifth switch configured to be closed when a voltage is sampled at the second input of the comparator core.

7. The circuit of claim 1, wherein the voltage generator comprises a buffer, a first branch of the buffer configured to receive the predetermined input current and a second branch of the buffer configured to generate the first voltage.

8. The circuit of claim 7, wherein the voltage generator further comprises a first transistor and a second transistor coupled in series in the first branch of the buffer, the first and second transistors configured to limit the maximum current of the first stage, the maximum current characterized as a maximum short circuit current of the first stage.

9. A circuit comprising:
  a comparator core configured to compare a first input voltage at a first input with a second input voltage at a second input and generate a digital value at an output based on a difference between the first input voltage and the second input voltage, the comparator core including a first stage having an input selectively coupled to the first input and the second input, and a second stage selectively coupled to the first stage via a first switch, the first switch coupled to an output of the first stage and an input to the second stage, a second switch coupled to the input to the second stage and a ground potential; and
  a voltage generator coupled to provide a first operating voltage to the first stage and a second, different operating voltage to the second stage and a third stage, the voltage generator configured and arranged to generate the first operating voltage and the second operating voltage based on a predetermined input current, a maximum current of the first stage, the second stage, and the third stage being based on the predetermined input current.

10. The circuit of claim 9, wherein the input of the first stage is selectively coupled to the first input and the second input by way of a capacitor, a third switch and a fourth switch, a first terminal of the capacitor coupled to the input of the first stage and a second terminal of the capacitor coupled to the first input of the comparator core by way of the third switch and coupled to the second input of the comparator core by way of the fourth switch.

11. The circuit of claim 9, wherein the first stage comprises:
  a first transistor having a first current electrode coupled to the voltage generator to receive the first operating voltage; and
  a second transistor having a control electrode coupled to a control electrode of the first transistor to form the input of the first stage, a first current electrode coupled to a second current electrode of the first transistor to form an output of the first stage, and a second current electrode coupled to a supply terminal.

12. The circuit of claim 9, wherein the second stage is configured to be in a safe state when isolated from the first stage.

13. The circuit of claim 9, wherein the voltage generator comprises a buffer, a first branch of the buffer configured to receive the predetermined input current and a second branch of the buffer configured to generate the first operating voltage.

14. The circuit of claim 13, wherein the voltage generator further comprises a transistor pair coupled in series in the first branch of the buffer, the transistor pair configured to limit the maximum current of the first stage.

15. A circuit comprising:
  a comparator core configured and arranged to compare a first input voltage at a first input with a second input voltage at a second input and generate a digital value based on a difference between the first input voltage and the second input voltage, the comparator core comprising:
    a first transistor having a first current electrode coupled to a first voltage supply terminal;
    a second transistor, the second transistor having a control electrode coupled to a control electrode of the first transistor to form a first stage input, a first current electrode coupled to a second current electrode of the first transistor to form a first stage output, and a second current electrode coupled to a second voltage supply terminal;
    a capacitor having a first terminal coupled at the first stage input and a second terminal coupled to the first input by way of a first switch and coupled to the second input by way of a second switch;
    a third switch selectively coupling a second stage input to the first stage output, a fourth switch coupled to the second stage input and a ground potential; and
  a voltage generator coupled to provide a first operating voltage based on a predetermined input current at the first voltage supply terminal and a second, different operating voltage based on the predetermined input current at the second voltage supply terminal and a third voltage supply terminal, the voltage generator configured and arranged to limit a maximum current through the first transistor and second transistor based on the predetermined input current.

16. The circuit of claim 15, wherein the voltage generator comprises a buffer, a first branch of the buffer configured to receive the predetermined input current and a second branch of the buffer configured to generate the first operating voltage.

17. The circuit of claim 16, wherein the voltage generator further comprises a transistor pair coupled in series in the first branch of the buffer, the transistor pair configured to limit the maximum current of a first stage.

* * * * *